US 6,684,361 B2

(12) United States Patent
Tong et al.

(10) Patent No.: US 6,684,361 B2
(45) Date of Patent: Jan. 27, 2004

(54) DATA INTERLEAVER AND METHOD OF INTERLEAVING DATA

(75) Inventors: Wen Tong, Ottawa (CA); Catherine Leretaille, Paris (FR)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 10/413,355

(22) Filed: Apr. 14, 2003

(65) Prior Publication Data

US 2003/0189956 A1 Oct. 9, 2003

Related U.S. Application Data

(62) Division of application No. 09/531,470, filed on Mar. 20, 2000.

(30) Foreign Application Priority Data

Mar. 19, 1999 (CA) .............................................. 2266283

(51) Int. Cl.$^7$ .............................................. H03M 13/00
(52) U.S. Cl. ...................................... 714/756; 714/701
(58) Field of Search ................................ 714/756, 701; 711/127

(56) References Cited

U.S. PATENT DOCUMENTS

| 6,108,252 A | * | 8/2000 | Park ........................... 365/201 |
| 6,334,197 B1 | * | 12/2001 | Eroz et al. .................. 714/701 |
| 6,442,728 B1 | * | 8/2002 | Cui et al. .................... 714/786 |
| 6,543,013 B1 | * | 4/2003 | Li et al. ..................... 714/701 |
| 6,553,516 B1 | * | 4/2003 | Suda et al. ................. 714/702 |

* cited by examiner

Primary Examiner—Phung M. Chung
(74) Attorney, Agent, or Firm—Gibbons, Del Deo, Dolan, Griffinger & Vecchione

(57) ABSTRACT

Interleaving of data symbols comprises permuting rows and columns of a matrix of $N_r$ rows and $N_c$ columns, in which data symbols to be interleaved are represented row by row, in accordance with:

| Row Permutation | $I_r(k) = [\alpha_r k + f_c(l)] \mod N_r$ |
| Column Permutation | $I_c(l) = [\alpha_c l + f_r(k)] \mod N_c$ | where $I_r(k)$ represents a data symbol with a row index k, k is an integer from 1 to $N_r$, $\alpha_r$ is an integer, $f_c(l)$ is a non-zero function of a column index l, l is an integer from 1 to $N_c$, $I_c(l)$ represents a data symbol with the column index 1, $\alpha_c$ is an integer, $f_r(k)$ is zero or a function of the row index k, and $\mod N_r$ and $\mod N_c$ represent modulo-$N_r$ and modulo-$N_c$ arithmetic respectively, interleaved data symbols being derived from the matrix column by column. A data interleaver comprises a memory for sequentially storing data symbols to be interleaved and a relatively simple circuit for determining read addresses for the interleaved data symbols. the data interleaver is particularly suited for channel interleaving in a 3rd generation CDMA wireless communications system.

30 Claims, 2 Drawing Sheets

DATA INTERLEAVER AND METHOD OF INTERLEAVING DATA

CROSS-REFERENCE TO A CO-PENDING PATENT APPLICATION

This Application is a divisional application of a U.S. patent application Ser. No. 09/531,470 to Wen Tong et al., titled "Data Interleaver and Method Interleaving Data", Filed Mar. 20, 2000 pending, and is incorporated herein by reference in its entirety.

This invention relates to data interleavers and to methods of interleaving data symbols, and is particularly concerned with a so-called channel interleaver for interleaving data symbols in a communications system.

BACKGROUND

It is well known to perform interleaving of data in a communications system using forward error correction (FEC) in order, on deinterleaving, to distribute errors to facilitate their correction. Typically, such interleaving uses a block interleaver to interleave blocks of data. So-called turbo coding (parallel concatenated convolutional coding) uses an interleaver between inputs to two convolutional coders which produce respective parity bits from the input data before and after interleaving. With increasing attention being given to the use of turbo coding, particularly in wireless communications systems, attention has also been given to the form of the interleaver.

So-called 3rd generation CDMA (code division multiple access) wireless communications systems are also being developed which require a channel or inter-frame interleaver which operates to interleave or permute data in blocks corresponding to the radio frame duration, typically 10 ms. For example, a multi-stage block interleaver (MIL) has been proposed for channel (inter-frame) interleaving and for intra-frame interleaving.

However, in such systems the channel interleaver either precedes or follows a rate matching function which serves to match various data rates to the radio frame rate, and which typically involves puncturing (omission) of data symbols. It is necessary to avoid consecutive puncture of adjacent data symbols of coded blocks of data symbols, but the multi-stage interleaver suffers from a problem in this respect. A so-called potential puncturing grid (PPG) concept has been proposed to correct this problem, but the choice of an appropriate PPG depends on variables such as the frame size, number of frames, puncturing rate, and puncturing position.

Accordingly, it would be desirable to provide an interleaver which maximizes the distances by which adjacent punctured data symbols are separated, for arbitrary puncturing rates and puncturing positions, without any PPG.

An object of this invention is to provide an improved data interleaver and method of interleaving data symbols.

SUMMARY OF THE INVENTION

According to one aspect, this invention provides a method of interleaving data symbols comprising permuting rows and columns of a matrix of $N_r$ rows and $N_c$ columns, in which data symbols to be interleaved are represented row by row, in accordance with:

| Row Permutation | $I_r(k) = [\alpha_r k + f_c(l)] \bmod N_r$ |
|---|---|
| Column Permutation | $I_c(l) = [\alpha_c l + f_r(k)] \bmod N_c$ | where $I_r(k)$ represents a data symbol with a row index k, k is an integer from 1 to $N_r$, $\alpha_r$ is an integer, $f_c(l)$ is a non-zero function of a column index l, l is an integer from 1 to $N_c$, $I_c(l)$ represents a data symbol with the column index l, $\alpha_c$ is an integer, $f_r(k)$ is zero or a function of the row index k, and $\bmod N_r$ and $\bmod N_c$ represent modulo-$N_r$ and modulo-$N_c$ arithmetic respectively, interleaved data symbols being derived from the matrix column by column.

Preferably $f_c(l)=ml$ where m is an integer; for example m is 1 or is approximately equal to $N_r/N_c$. If $f_r(k)$ is not zero, then preferably $f_r(k)=nk$ where n is an integer; for example n=1. Conveniently $\alpha_r$ is the largest prime number less than $N_r/2$, and $\alpha_c$ is the largest prime number less than $N_c/2$.

The actual number of data symbols to be interleaved need not be exactly equal to $N_r N_c$ but can be a little less than this, in which case preferably the method further comprises the step of determining one or more matrix positions in which data symbols to be interleaved are not represented, interleaved data symbols not being derived from such determined matrix positions.

The invention also provides a data symbol interleaver arranged for carrying out a method as recited above.

Another aspect of the invention provides a data interleaver comprising: a memory arranged to sequentially store up to $N_c N_r$ data symbols to be interleaved at respective addresses, where $N_c$ and $N_r$ are integers greater than 1; a counter arranged to provide an index l from 1 to Nc, and a counter arranged to provide an index from 1 to Nr for each value of the index l; a circuit arranged to determine a first value $[\alpha_c l+nk] \bmod N_c$ and a second value $[\alpha_r k+ml] \bmod N_r$, where $\alpha_c$, $\alpha_r$, and m are positive integers and n is a positive integer or zero, and $\bmod N_r$ and $\bmod N_c$ represent modulo-$N_r$ and modulo-$N_c$ arithmetic respectively; and an address combiner arranged to combine the first value as a more significant part and the second value as a less significant part of a read address for reading interleaved data symbols from the memory.

The data interleaver can further comprise an address decoder responsive to at least one read address produced by the address combiner at which a data symbol to be interleaved is not stored in the memory for inhibiting reading from the memory from such address. In this case conveniently the data interleaver further includes a first-in, first-out buffer arranged to buffer interleaved data symbols read from the memory.

The invention further provides a channel interleaver for a communications system including a data rate matching circuit which performs puncturing of data symbols, comprising a data interleaver as recited above.

BRIEF DESCRIPTION OF THE DRAWINGS

The invention will be further understood from the following description with reference to the accompanying drawings, in which.

DETAILED DESCRIPTION

Figure 1:
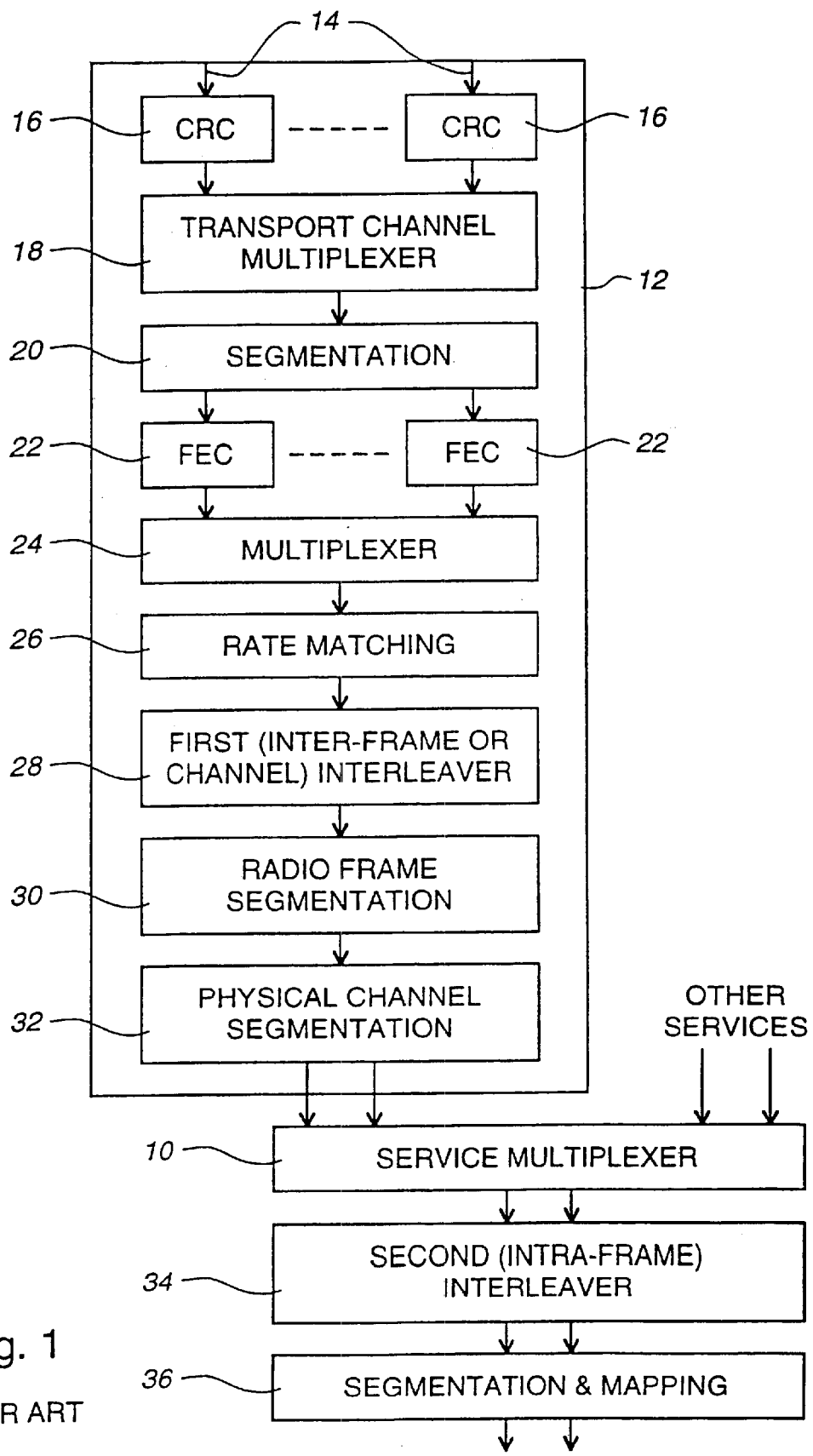
FIG. 1 illustrates a known arrangement for service multiplexing and channel interleaving in a 3rd generation CDMA communications system.

Referring to FIG. 1, there is illustrated a known arrangement for service multiplexing and channel interleaving in a 3rd generation CDMA radio communications system. The arrangement includes a service multiplexer 10 which serves to multiplex together a plurality of data signal streams, referred to as main stream services or QoS (Quality of Service) channels, which are supplied via respective service blocks 12 only one of which is illustrated. Each service block 12 is supplied at inputs 14 with a plurality of constituent input signals, which may for example comprise any of various types of signals such as voice, data, and multimedia signals. These input signals may have arbitrary transmission rates, frame sizes, and other parameters. The input signals have CRC (cyclic redundancy check) codes added in blocks 16 and are multiplexed together in a transport channel multiplexer 18. The multiplexed signals are segmented, for encoding, in a segmentation block 20, and the segmented signals are subjected to FEC (forward error correction) coding in FEC blocks 22. The encoded signals are multiplexed in a multiplexer 24 and subjected to rate matching (puncturing (deletion) of redundant symbols or repetition (stuffing) of additional symbols) in a block 26 to match the data rate to the radio communications rate (or so-called air rate) with frames of 10 ms duration. Primarily in order to separate adjacent symbols to reduce the adverse effects of errors due to fading in the radio channel, the data symbols are interleaved in a first interleaver 28, which is referred to as a channel or inter-frame interleaver because it operates to permute blocks each of 10 ms of data symbols. Although in FIG. 1 the interleaver 28 is shown following the rate matching block 26, the positions of these functions may be interchanged. For example, these functions may be in the order shown in FIG. 1 for downlink transmission of signals from a central station, and may be in the reversed order for uplink transmission of signals to the central station.

Following the functions 26 and 28, the resulting rate matched and interleaved signals are segmented for radio frames and physical channels in segmentation blocks 30 and 32 respectively to produce the signals for multiplexing by the multiplexer 10. Signals output by the multiplexer 10 are interleaved by a second interleaver 34 the outputs of which are segmented and mapped to dedicated physical channels in a segmentation and mapping block 36 for communications via a CDMA radio communications path in known manner.

The present invention is directed to implementations of the first interleaver 28, and is particularly concerned with providing an implementation of the first interleaver 28 with a performance that is sufficiently good to enable the second interleaver 34 to be omitted or reduced to a simple shuffling operation. This is desirable in particular because the second interleaver 34 has the potential to degrade the interleaving performed by each first interleaver 28, whereas each first interleaver 28 can be optimized for its particular rate matched data stream and QoS. Alternatively, the second interleaver 34 can also be implemented as an interleaver in accordance with an embodiment of this invention, the parameters of both interleavers being chosen to provide an optimized performance of the overall arrangement.

Accordingly, the first interleaver 28 is implemented as an algebraic interleaver providing a good random spreading property which facilitates straightforward rate matching by puncturing and symbol repetition. Accordingly, the multiple encoded symbol blocks for each QoS channel are mapped into a 2-dimensional matrix and are subjected to linear congruential rules to permute the rows and columns of the matrix to implement the interleaving function. A maximum interleaving depth and time span can be determined by searching a set of best parameters. The interleaver consequently has a relatively simple form without disadvantages of known interleavers, such as requiring large memory sizes for look-up tables or inadequately accommodating the rate matching function.

Although the following description refers to rows and columns of a matrix, it should be understood that this is for convenience and clarity, that the rows and columns can be interchanged without changing the function of the interleaver, and that in practice and as described below the interleaver can operate by equivalent control of read or write addressing of memory locations of a linear memory in which data symbols are stored, without any actual movement of the stored data symbols among the memory locations.

An interleaver in accordance with embodiments of this invention operates to implement the following steps:

1. Represent a number $N_c$ of encoded blocks of data symbols each of length $N_r$ data symbols as a matrix of $N_r$ rows and $N_c$ columns.
2. Permute the rows and columns of the matrix in accordance with:

| Row Permutation | $I_r(k) = [\alpha_r k + f_c(l)] \mod N_r$ |
| --- | --- |
| Column Permutation | $I_c(l) = [\alpha_c l + f_r(k)] \mod N_c$ | where $I_r(k)$ represents a data symbol with a row index k, k is an integer from 1 to $N_r$, $\alpha_r$ is a row permutation parameter and is an integer, $f_c(l)$ is a positive function of a column index l, l is an integer from 1 to $N_c$, $I_c(l)$ represents a data symbol with the column index l, $\alpha_c$ is a column permutation parameter and is an integer, $f_r(k)$ is a positive function of the row index k, and $\mod N_r$ and $\mod N_c$ represent modulo-$N_r$ and modulo-$N_c$ arithmetic respectively.

3. Derive interleaved data symbols from the matrix column by column.

In the row permutation of step 2, $f_c(l) \neq 0$ to avoid puncturing of consecutive data symbols due to the rate matching. For example, the function $f_c(l)=ml$ where m is a constant integer, for example m=1 so that $f_c(l)=1$. The column permutation of step 2 can use bit reversal as is known in the art, or the function $f_r(k)$ can be zero. Alternatively, for example, the function $f_r(k)=nk$ where n is a constant integer, for example n=1 so that $f_r(k)=k$. It can be appreciated that the order in which the row and column permutations of step 2 are performed is arbitrary, i.e. either the row permutation or the column permutation can be performed first, or both permutations can be performed contemporaneously.

In a first embodiment of the invention described below, for example the parameter $\alpha_r$ is chosen to be the largest prime number less than $\lfloor N_r/2 \rfloor$, the parameter ac is chosen to be the largest prime number less than $\lfloor N_c/2 \rfloor$, $m=\lfloor N_r/N_c \rfloor$, and n=0. The symbols $\lfloor \ \rfloor$ refer to rounding down to an integer.

In this example, $N_c=8$, $N_r=10$, $\alpha_r=3$, $\alpha_c=3$, m=1, and n=0. Thus, in step 1, 80 data symbols, identified by the numbers 1 to 80 in the following tables, in eight 10 ms coded blocks each of 10 coded symbols, are represented row by row in a 10 by 8 matrix with the row index k and the column index l, as shown by Table 1:

TABLE 1

| k | 1 | 2 | 3 | 4 | 5 | 6 | 7 | 8 |
|---|---|---|---|---|---|---|---|---|
| 1 | 1 | 2 | 3 | 4 | 5 | 6 | 7 | 8 |
| 2 | 9 | 10 | 11 | 12 | 13 | 14 | 15 | 16 |
| 3 | 17 | 18 | 19 | 20 | 21 | 22 | 23 | 24 |
| 4 | 25 | 26 | 27 | 28 | 29 | 30 | 31 | 32 |
| 5 | 33 | 34 | 35 | 36 | 37 | 38 | 39 | 40 |
| 6 | 41 | 42 | 43 | 44 | 45 | 46 | 47 | 48 |
| 7 | 49 | 50 | 51 | 52 | 53 | 54 | 55 | 56 |
| 8 | 57 | 58 | 59 | 60 | 61 | 62 | 63 | 64 |
| 9 | 65 | 66 | 67 | 68 | 69 | 70 | 71 | 72 |
| 10 | 73 | 74 | 75 | 76 | 77 | 78 | 79 | 80 |

The row permutation $I_r(k)=[3k+1]\mod 10$ produces a result as shown by the following Table 2:

TABLE 2

| k | 1 | 2 | 3 | 4 | 5 | 6 | 7 | 8 |
|---|---|---|---|---|---|---|---|---|
| 1 | 25 | 34 | 43 | 52 | 61 | 70 | 79 | 8 |
| 2 | 49 | 58 | 67 | 76 | 5 | 14 | 23 | 32 |
| 3 | 73 | 2 | 11 | 20 | 29 | 38 | 47 | 56 |
| 4 | 17 | 26 | 35 | 44 | 53 | 62 | 71 | 80 |
| 5 | 41 | 50 | 59 | 68 | 77 | 6 | 15 | 24 |
| 6 | 65 | 74 | 3 | 12 | 21 | 30 | 39 | 48 |
| 7 | 9 | 18 | 27 | 36 | 45 | 54 | 63 | 72 |
| 8 | 33 | 42 | 51 | 60 | 69 | 78 | 7 | 16 |
| 9 | 57 | 66 | 75 | 4 | 13 | 22 | 31 | 40 |
| 10 | 1 | 10 | 19 | 28 | 37 | 46 | 55 | 64 |

The column permutation $I_c(l)=[3l]\mod 8$ then produces a result as shown by the following Table 3:

TABLE 3

| k | 1 | 2 | 3 | 4 | 5 | 6 | 7 | 8 |
|---|---|---|---|---|---|---|---|---|
| 1 | 43 | 70 | 25 | 52 | 79 | 34 | 61 | 8 |
| 2 | 67 | 14 | 49 | 76 | 23 | 58 | 5 | 32 |
| 3 | 11 | 38 | 73 | 20 | 47 | 2 | 29 | 56 |
| 4 | 35 | 62 | 17 | 44 | 71 | 26 | 53 | 80 |
| 5 | 59 | 6 | 41 | 68 | 15 | 50 | 77 | 24 |
| 6 | 3 | 30 | 65 | 12 | 39 | 74 | 21 | 48 |
| 7 | 27 | 54 | 9 | 36 | 63 | 18 | 45 | 72 |
| 8 | 51 | 78 | 33 | 60 | 7 | 42 | 69 | 16 |
| 9 | 75 | 22 | 57 | 4 | 31 | 66 | 13 | 40 |
| 10 | 19 | 46 | 1 | 28 | 55 | 10 | 37 | 64 |

In step 3, the data symbols are derived column by column from Table 3, i.e., with the interleaved order [43, 67, . . . , 19, 70, 14, . . . , 40, 64].

In a second embodiment of the invention, with $N_c \leq 8$ as is typically the case for an arrangement as described above with reference to FIG. 1, the parameter $\alpha_c$ is chosen to be 1 if $N_c \leq 3$ and is chosen to be 3 if $N_c$ is from 4 to 8, the parameter $\alpha_r$ is chosen as above to be the largest prime number less than $\lfloor N_r/2 \rfloor$, the parameter $m=\lfloor N_r/8 \rfloor$, and $n=1$. Thus with $N_c=8$ and $N_r=10$ as in Table 1 above, $\alpha_r=3$, $\alpha_c=3$, and $m=1$.

The column permutation $I_c(l)=[3l+k]\mod 8$ produces from Table 1 a result as shown by the following Table 4:

TABLE 4

| k | 1 | 2 | 3 | 4 | 5 | 6 | 7 | 8 |
|---|---|---|---|---|---|---|---|---|
| 1 | 4 | 7 | 2 | 5 | 8 | 3 | 6 | 1 |
| 2 | 13 | 16 | 11 | 14 | 9 | 12 | 15 | 10 |
| 3 | 22 | 17 | 20 | 23 | 18 | 21 | 24 | 19 |
| 4 | 31 | 26 | 29 | 32 | 27 | 30 | 25 | 28 |
| 5 | 40 | 35 | 38 | 33 | 36 | 39 | 34 | 37 |
| 6 | 41 | 44 | 47 | 42 | 4S | 48 | 43 | 46 |
| 7 | 50 | 53 | 5E | 51 | 54 | 49 | 52 | 55 |
| 8 | 59 | 62 | 57 | 60 | 63 | 58 | 61 | 64 |
| 9 | 68 | 71 | 66 | 69 | 72 | 67 | 70 | 65 |
| 10 | 77 | 80 | 75 | 78 | 73 | 76 | 79 | 74 |

The row permutation $I_r(k)=[3k+l]\mod 10$ then produces a result as shown by the following Table 5:

TABLE 5

| k | 1 | 2 | 3 | 4 | 5 | 6 | 7 | 8 |
|---|---|---|---|---|---|---|---|---|
| 1 | 31 | 35 | 47 | 51 | 63 | 67 | 79 | 1 |
| 2 | 50 | 62 | 66 | 78 | 8 | 12 | 24 | 28 |
| 3 | 77 | 7 | 11 | 23 | 27 | 39 | 43 | 55 |
| 4 | 22 | 26 | 38 | 42 | 54 | 58 | 70 | 74 |
| 5 | 41 | 53 | 57 | 69 | 73 | 3 | 15 | 19 |
| 6 | 68 | 80 | 2 | 14 | 18 | 30 | 34 | 46 |
| 7 | 13 | 17 | 29 | 33 | 45 | 49 | 61 | 65 |
| 8 | 40 | 44 | 56 | 60 | 72 | 76 | 6 | 10 |
| 9 | 59 | 71 | 75 | 5 | 9 | 21 | 25 | 37 |
| 10 | 4 | 16 | 20 | 32 | 36 | 48 | 52 | 64 |

In step 3, the data symbols are derived column by column from Table 5, i.e., with the interleaved order [31, 50, . . . , 4, 35, 62, . . . , 37, 64].

Numerous other combinations of the parameters $\alpha_c$, $\alpha_r$, m, and n can be chosen to result in different interleaved results; for example the parameters $\alpha_c$ and $\alpha_r$ may have larger values such as 5, 7, etc. and may be different from one another.

Figure 2:
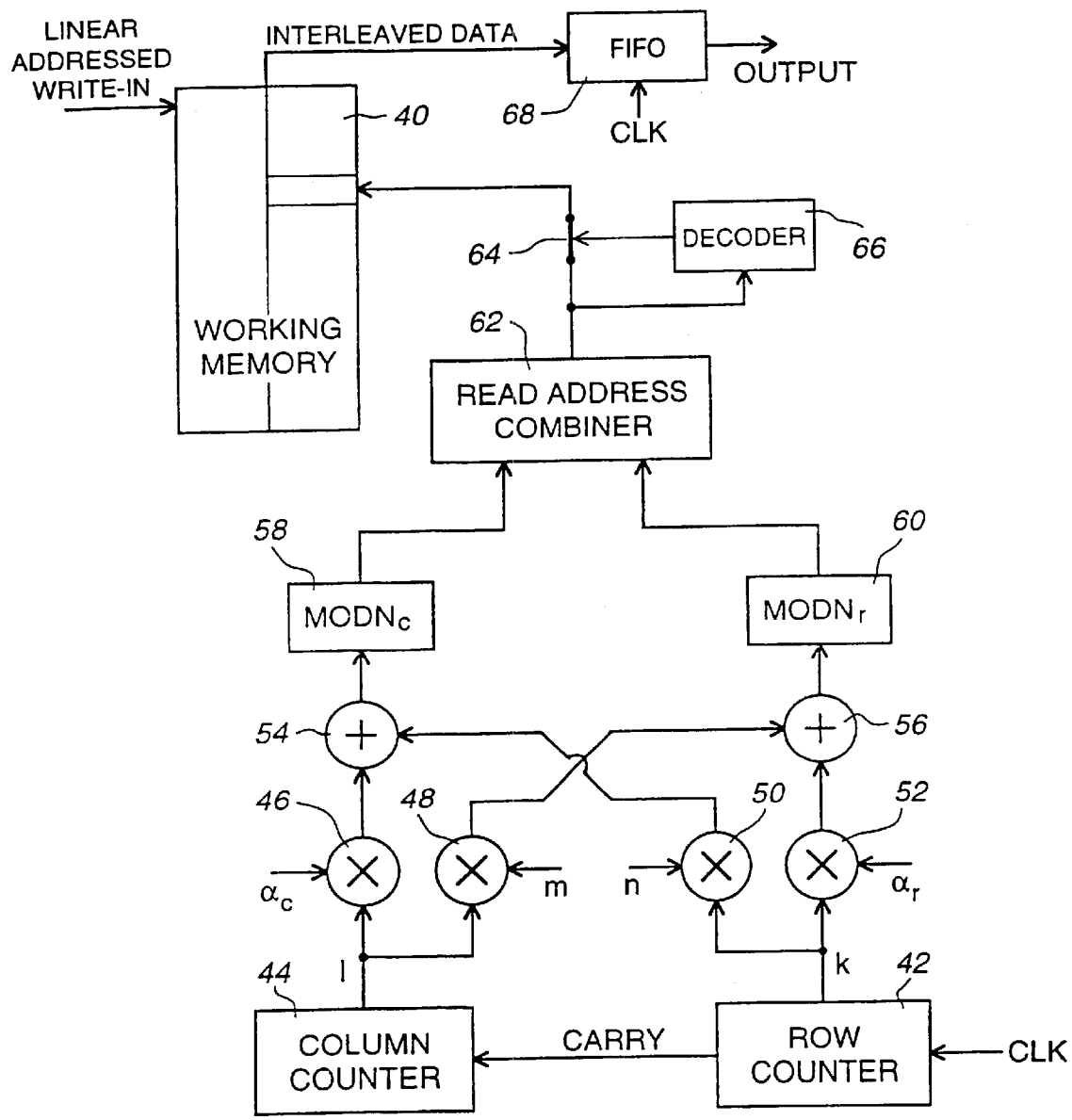
FIG. 2 illustrates an implementation of an interleaver in accordance with an embodiment of this invention.

FIG. 2 illustrates an implementation of an interleaver 28 in accordance with an embodiment of this invention. As illustrated in FIG. 2, the interleaver includes a working memory 40 with two halves, alternately used in known manner for writing into and reading from the memory, each for storing the $N_r N_c$ data symbols represented in the matrix as described above, these data symbols being written into the memory linearly corresponding to the row-by-row organization of the matrix illustrated by Table 1 above. A modulo-$N_r$ row counter 42 is responsive to a clock signal CLK to provide a count representing the row index k, and a carry output of this counter 42 is supplied to a modulo-$N_c$ column counter 44 to provide a count representing the column index l. The count of the column counter 44 is supplied to multipliers 46 and 48 which are also supplied with the parameters $\alpha_c$ and m respectively to produce products representing $\alpha_c l$ and ml respectively, and the count of the row counter 42 is supplied to multipliers 50 and 52 which are also supplied with the parameters n and $\alpha_r$ respectively to produce products representing nk and $\alpha_r k$ respectively. An adder 54 adds the outputs of the multipliers 46 and 50, and an adder 56 adds the outputs of the multipliers 48 and 52. The outputs of the adders 54 and 56 are reduced to modulo-$N_c$ and modulo-$N_r$ forms respectively by modulo functions 58 and 60 respectively, each of which can comprise comparison and subtraction functions. Outputs of the functions 58 and 60 are combined in a combiner 62 to produce an address for reading the respective data symbol in its interleaved sequence from the memory 40. As illustrated in FIG. 2, the read address is supplied to the memory 40 via a switch 64 which is provided as described below.

If the number of rows $N_r$ is a power of two, then the combiner 62 can simply combine the output of the function 60 as the least significant bits, and the output of the function 58 as the most significant bits, of the read address for the memory 40; equivalently the output of the function 60 is added by the combiner 62 to $N_r$ times the output of the function 58. It can be appreciated that if m=1 then the multiplier 48 is not required, if n=1 then the multiplier 50 is not required, and if n=0 then neither the multiplier 50 nor the adder 54 is required. Accordingly, the implementation of the interleaver can be even simpler than that illustrated in FIG. 2.

It may be desired to interleave data symbols in arbitrary-sized frames that are not an integer multiple of $N_c$. In this case, the number of rows of the matrix is selected to accommodate all of the data symbols of the frame to be interleaved, and the last few (less than $N_c$) memory locations in the working memory 40 are not written into. In order to omit the data symbols of these memory locations from the interleaved data symbols, the interleaver of FIG. 2 also includes a decoder 66 which detects these memory locations in the read address output of the combiner 62, and upon such detection opens the switch 64 to prevent reading of data from the memory 40 in respect of these locations. In order to provide a constant data output rate within each frame of interleaved data symbols read out from the memory 40, the interleaver of FIG. 2 further includes a FIFO (first-in, first-out) memory 68 via which the interleaved data symbols are supplied to an output of the interleaver, the FIFO 68 being pre-filled at the start of each interleaved data symbol frame and having a size (e.g. up to $N_c$) sufficient to allow for the non-read, and hence omitted, memory locations.

As can be appreciated from the above description, the interleaver has a relatively simple structure so that it can be easily implemented, it does not require significant memory other than the working memory 40, it can easily operate in real time, and it can accommodate arbitrary data frame sizes. In addition, a corresponding deinterleaver can have substantially the same structure, so that it is also conveniently and easily implemented.

Although particular embodiments and examples of the invention have been described above, it can be appreciated that numerous modifications, variations, and adaptations may be made without departing from the scope of the invention as defined in the claims.

What is claimed is:

1. A data interleaver comprising:
   a memory arranged to sequentially store up to $N_cN_r$ data symbols to be interleaved at respective addresses, where $N_c$ and $N_r$ are integers greater than 1;
   a counter arranged to provide an index l from 1 to $N_c$, and a counter arranged to provide an index from 1 to $N_r$ for each value of the index l;
   a circuit arranged to determine a first value $[\alpha_c l+nk]$ mod$N_c$ and a second value $[\alpha_r k+ml]$mod$N_r$, where $\alpha_c$, $\alpha_r$, and m are positive integers and n is a positive integer or zero, and mod$N_r$ and mod$N_c$ represent modulo-$N_r$ and modulo-$N_c$ arithmetic respectively; and
   an address combiner arranged to combine the first value as a more significant part and the second value as a less significant part of a read address for reading interleaved data symbols from the memory.

2. A data interleaver as claimed in claim 1 wherein m=1.
3. A data interleaver as claimed in claim 1 wherein m is approximately equal to $N_r/N_c$.
4. A data interleaver as claimed in claim 1 wherein n=0.
5. A data interleaver as claimed in claim 1 wherein n=1.
6. A data interleaver as claimed in claim 1 wherein $\alpha_r$ is the largest prime number less than $N_r/2$.
7. A data interleaver as claimed in claim 1 wherein $\alpha_c$ is the largest prime number less than $N_c/2$.
8. A data interleaver as claimed in claim 1 and further comprising an address decoder responsive to at least one read address produced by the address combiner at which a data symbol to be interleaved is not stored in the memory for inhibiting reading from the memory from such address.
9. A data interleaver as claimed in claim 8 and including a first-in, first-out buffer arranged to buffer interleaved data symbols read from the memory.
10. A channel interleaver for a communications system including a data rate matching circuit which performs puncturing of data symbols, comprising a data interleaver as claimed in claim 1.
11. A method for data interleaving comprising the steps of:
    sequentially storing up to $N_cN_r$ data symbols to be interleaved at respective addresses, where $N_c$ and $N_r$ are integers greater than 1;
    providing a counter index l from 1 to $N_c$, and a counter index from 1 to $N_r$ for each value of the counter index l;
    determining a first value mod$N_c$ and a second value mod$N_r$, where $\alpha_c$ and $\alpha_r$ and m are positive integers and n is a positive integer or zero, and mod$N_c$ and mod$N_r$ represent modulo-$N_c$ and modulo-$N_r$, respectively; and
    address combining the first value as a more significant part and the second value as a less significant part of a related address for reading interleaved data symbols from the memory.
12. The method of claim 11, wherein m=1.
13. The method of claim 11, m is approximately equal to $N_r/N_c$.
14. The method of claim 11, wherein n=0.
15. The method of claim 11, wherein n=1.
16. The method of claim 11, wherein $\alpha_r$ is the largest prime number less than $N_r/2$.
17. The method of claim 11, wherein $\alpha_c$ is the largest prime number less than $N_c/2$.
18. The method of claim 11, further comprising the step of
    responding to at least one read address produced in said combining step at which a data symbol to be interleaved is not stored for inhibiting reading from such address.
19. The method of claim 18, further comprising the step of
    buffering interleaved data symbols read in said responding step.
20. The method of claim 11, further comprising the step of:
    puncturing of data symbols via data rate matching.
21. An apparatus for data interleaving comprising the steps of:
    a means for sequentially storing in memory up to $N_cN_r$ data symbols to be interleaved at respective addresses, where $N_c$ and $N_r$ are integers greater than 1;
    a means for providing a counter index l from 1 to $N_c$, and a counter index from 1 to $N_r$ for each value of the counter index l;

a means for determining a first value $[\alpha_c l + nk] \bmod N_c$ and a second value $[\alpha_r k + ml] \bmod N_r$, where $\alpha_c$ and $\alpha_r$ and m are positive integers and n is a positive integer or zero, and $\bmod N_c$ and $\bmod N_r$ represent modulo-$N_c$ and modulo-$N_r$, respectively; and a means for address combining the first value as a more significant part and the second value as a less significant part of a related address for reading interleaved data symbols from the memory.

22. The apparatus of claim 21, wherein m=1.

23. The apparatus of claim 21, m is approximately equal to $N_r/N_c$.

24. The apparatus of claim 21, wherein n=0.

25. The apparatus of claim 21, wherein n=1.

26. The apparatus of claim 21, wherein $\alpha_r$ is the largest prime number less than $N_r/2$.

27. The apparatus of claim 21, wherein $\alpha_c$ is the largest prime number less than $N_c/2$.

28. The apparatus of claim 21, further comprising an address decoder means for responding to at least one read address produced by said means for combining at which a data symbol to be interleaved is not stored in the memory for inhibiting reading from the memory from such address.

29. The apparatus of claim 28, further comprising a first-in and first-out buffer means for buffering interleaved data symbols read from the memory.

30. The apparatus of claim 21, further comprising a channel interleaver means for a communications system having a data rate matching circuit for puncturing of data symbols.

* * * * *

UNITED STATES PATENT AND TRADEMARK OFFICE
CERTIFICATE OF CORRECTION

PATENT NO. : 6,684,361 B2
DATED : January 27, 2004
INVENTOR(S) : Wen Tong et al.

It is certified that error appears in the above-identified patent and that said Letters Patent is hereby corrected as shown below:

Column 8,
Line 29, "...$modN_c$..." should be -- ... $[\alpha_c l + nk] modN_c$... --.
Line 30, "...$modN_r$..." should be -- ... $[\alpha_r k + ml] modN_r$,... --.

Signed and Sealed this

Sixth Day of September, 2005

JON W. DUDAS
*Director of the United States Patent and Trademark Office*